(12) United States Patent
Shen

(10) Patent No.: US 6,537,870 B1
(45) Date of Patent: Mar. 25, 2003

(54) METHOD OF FORMING AN INTEGRATED CIRCUIT COMPRISING A SELF ALIGNED TRENCH

(75) Inventor: Hua Shen, San Francisco, CA (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/675,432

(22) Filed: Sep. 29, 2000

(51) Int. Cl.⁷ .......................................... H01L 21/8242
(52) U.S. Cl. ........................ 438/243; 438/248; 438/268
(58) Field of Search ................................ 438/243–249, 438/386–389, 268–272

(56) References Cited

U.S. PATENT DOCUMENTS 6,156,607 A * 12/2000 Noble et al. ................ 438/244
6,350,635 B1 * 2/2002 Noble et al. ................ 438/156
6,395,597 B2 * 5/2002 Noble ......................... 438/242

* cited by examiner

Primary Examiner—Jey Tsai
(74) Attorney, Agent, or Firm—Stanton Braden

(57) ABSTRACT

An integrated circuit comprising a vertically oriented device formed with a substantially SELF ALIGNED process, in which the trench, active area (e.g., 128, 228), and gate (e.g., 132, 232) of a DRAM cell may be formed using a minimal number of masks and lithographic steps. Using this process, a DRAM cell comprising a vertical transistor and a buried word line (e.g., 132, 232) may be formed. A gate dielectric (e.g., 130, 230) may be disposed adjacent the active area, and the portion of the buried word line adjacent the gate dielectric may function as the vertically oriented gate for the vertical transistor. The DRAM memory cell may comprise one of a variety of capacitors, such a trench capacitor underlying the vertical transistor, or a stack capacitor (e.g., 241) overlying the vertical transistor. When a stack capacitor is used, a buried bit line (e.g., 208) underlying the vertical transistor may also be used.

24 Claims, 22 Drawing Sheets

FIG. 4A
(AMENDED)
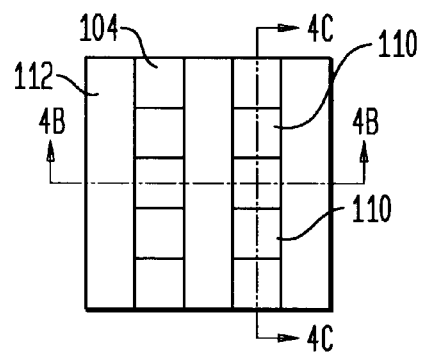

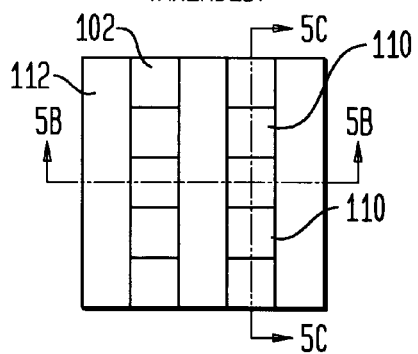
FIG. 5A
(AMENDED)

FIG. 6A
(AMENDED)
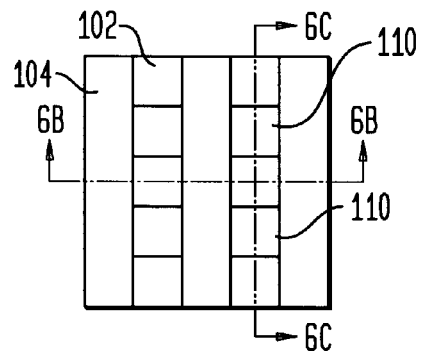

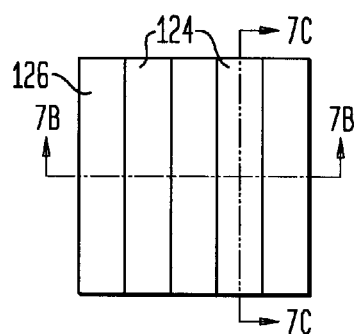
FIG. 7A
(AMENDED)
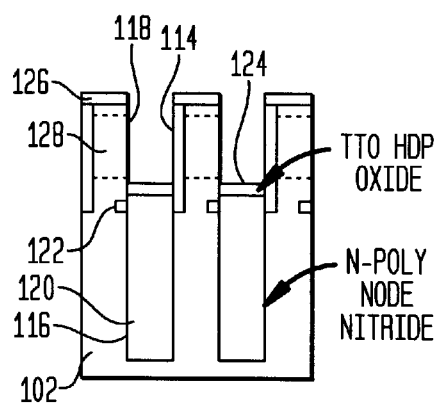
FIG. 7B
(AMENDED)
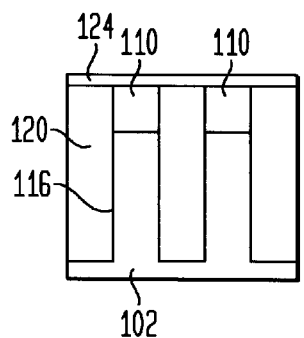
FIG. 7C
(AMENDED)

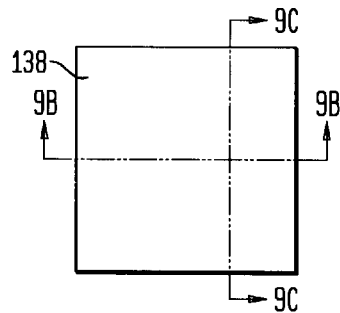
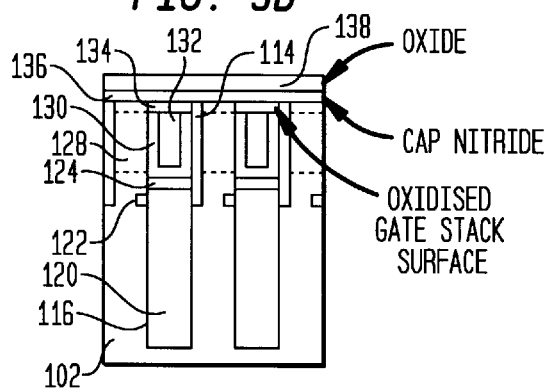
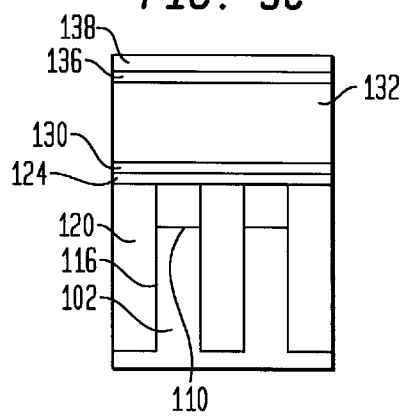

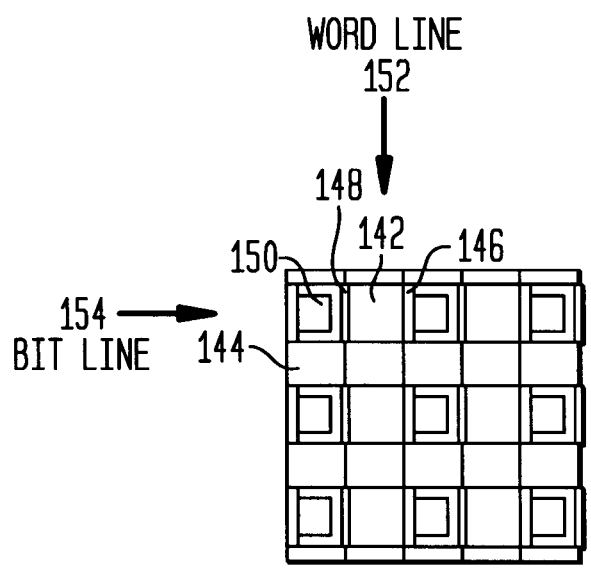

FIG. 15A
(AMENDED)
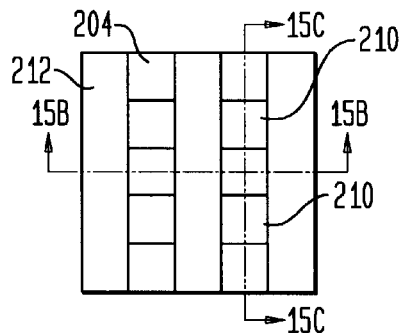

FIG. 16A
(AMENDED)
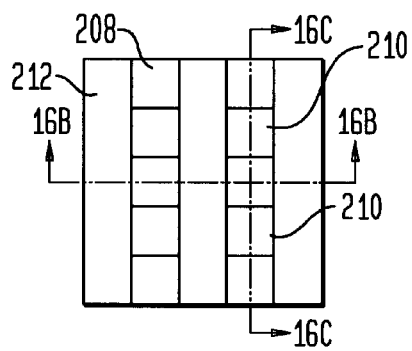

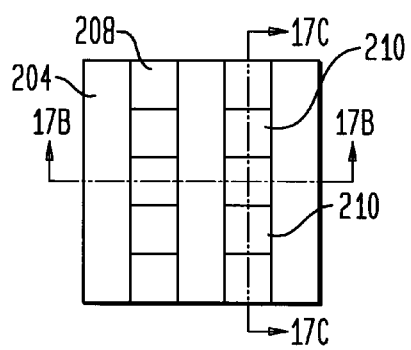
FIG. 17A
(AMENDED)

FIG. 18A
(AMENDED)
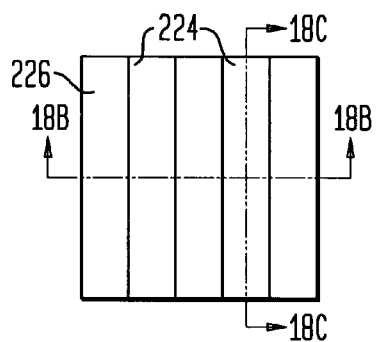
FIG. 18C
(AMENDED)
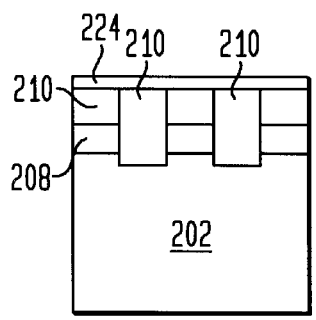

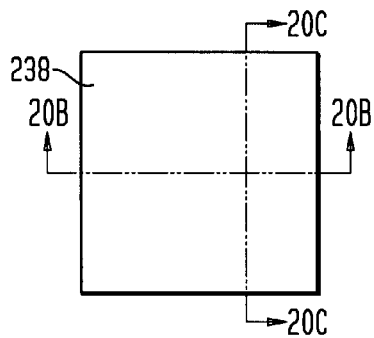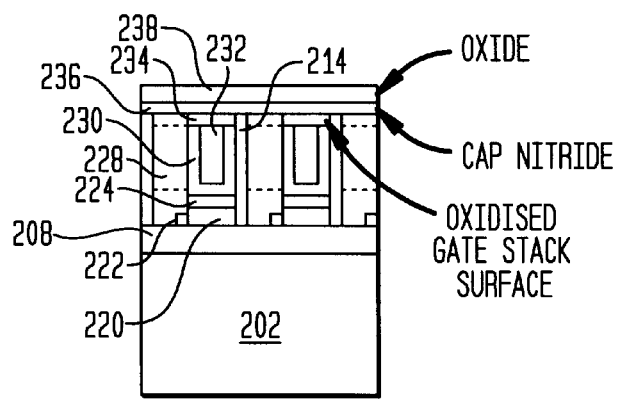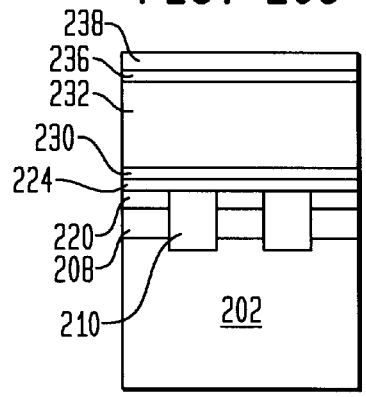

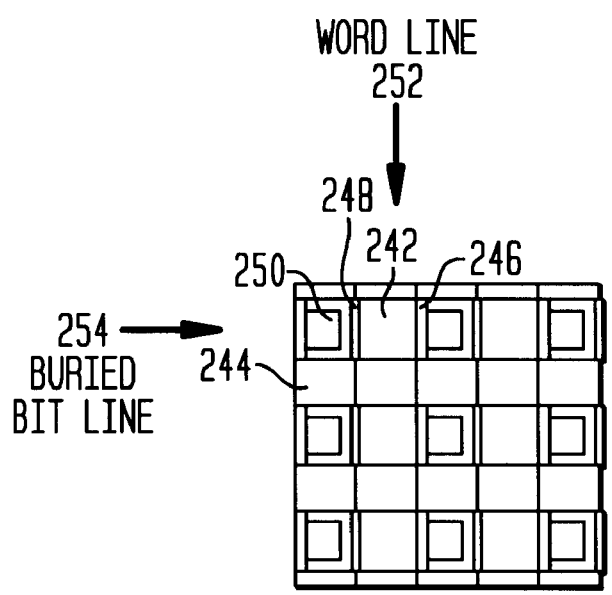

METHOD OF FORMING AN INTEGRATED CIRCUIT COMPRISING A SELF ALIGNED TRENCH

CROSS-REFERENCE TO RELATED APPLICATIONS

This application is related to commonly assigned, U.S. patent application Ser. No. 09/576,465, filed May 23, 2000, entitled METHOD OF FORMING A VERTICALLY ORIENTED DEVICE IN AN INTEGRATED CIRCUIT, now U.S. Pat. No. 6,426,253, issued Dec. 5, 2000; and commonly assigned, co-pending U.S. patent application Ser. No. 09/957,937, filed Sep. 21, 2001, entitled METHOD OF FORMING A SELF ALIGNED TRENCH IN A SEMICONDUCTOR USING A PATTERNED SACRIFICIAL LAYER FOR DEFINING THE TRENCH OPENING; which applications are hereby incorporated herein by reference.

TECHNICAL FIELD

The present invention relates generally to a system and method for fabricating integrated circuits ("IC"s), and more particularly to an integrated circuit comprising a small planar area memory cell with a SELF ALIGNED trench and vertical transistor, and method of forming thereof.

BACKGROUND

The semiconductor industry is continuously trying to decrease the size of the semiconductor devices located on integrated circuits. Miniaturization is generally needed to accommodate the increasing density of circuits necessary for today's semiconductor products. For example, it is not uncommon for there to be millions of semiconductor devices on a single semiconductor product.

Typically, the focus of miniaturization has been placed on the two-dimensional horizontal plane of a semiconductor device, and devices have approached sizes down to tenths of microns and less. There is some limit, however, as to how far a horizontally oriented semiconductor device can be shrunk, and as devices are made even smaller, it is generally becoming increasingly difficult to further miniaturize a device's horizontal dimensions. In addition, the decreasing horizontal dimensions of semiconductor devices generally tend to create problems in the operational characteristics of the semiconductor devices.

One such semiconductor product widely used in electronic systems for storing data is a semiconductor memory, and one common type of semiconductor memory is a dynamic random access memory ("DRAM"). A DRAM may include millions or billions of individual DRAM cells, each cell storing one bit of data. A DRAM memory cell typically includes an access field-effect transistor ("FET") and a storage capacitor. The access FET allows the transfer of data charges to and from the storage capacitor during reading and writing operations. In addition, the data charges on the storage capacitor are periodically refreshed during a refresh operation.

Semiconductor memory density is typically limited by a minimum feature size F, that is imposed by processes (e.g., lithographic) used during fabrication. The planar area of current prior art devices is typically about 8 $F^2$. There is a continuing need in the art to provide even higher density memories in order to further increase data storage capacity and reduce manufacturing costs.

One way of increasing the data storage capacity of semiconductor memories is to reduce the amount of integrated circuit horizontal planar area consumed by each memory cell. For horizontally oriented devices, this may be done by decreasing the size of the access FET or the storage capacitor, or both. This approach has limits, however, due to minimum producible structure size in a given fabrication technology, and the problems associated with devices with small dimensions, such as hot carriers, punch through, and excess leakage.

A different approach to providing planar area reduction is the use of a three-dimensional arrangement of the access FET and the storage capacitor. One such arrangement is a planar FET next to a deep trench capacitor. The trench capacitor has plates which are located vertically along the walls of the trench instead of being parallel to the surface of the integrated circuit substrate. This permits a large capacitance per planar unit area of substrate, while at the same time allowing the device to be of a manageable size for purposes of operation.

Further reduction in the amount of planar area required for each cell, may be achieved by using a vertical trench transistor in conjunction with a vertical trench capacitor in a memory cell. In a typical design, the vertical capacitor is generally fabricated in a trench, with one conductive plate being formed in the substrate, the dielectric being formed on the trench sidewalls, and the other conductive plate being formed in the interior of the trench. A vertical trench transistor is generally fabricated adjacent to an upper portion of the trench, with the source and drain being fabricated in the substrate, and the vertically-oriented gate being fabricated in the trench.

Alternatively, a vertical transistor may be paired with a stack capacitor in a memory cell. In a typical design, the vertical trench transistor may have a vertically-oriented gate being fabricated in the substrate, and the stack capacitor may be formed above the vertical transistor. A stack capacitor generally utilizes a three-dimensional structure at the surface of or on the substrate, as opposed to being formed in a trench under the substrate surface like a trench capacitor.

There are generally several problems, however, with prior art approaches to fabricating a smaller planar area DRAM cell. One difficult fabrication issue is that several lithographic/mask steps are used in typical prior art methods. As an example, there may be masks associated with forming a deep trench, forming an active area, and forming a gate. Generally, the more mask steps involved, however, the less robust and the lower the yield of the overall process. Each mask step poses a risk of misalignment between the mask and the device in process. Generally, mask alignment is especially critical when working with features with a high aspect ratio, height to width, as with a deep trench.

SUMMARY OF THE INVENTION

These problems are generally solved or circumvented, and technical advantages are generally achieved, by a preferred embodiment of the invention in which a trench for a DRAM cell is formed with a substantially SELF ALIGNED process. The trench, active area, and gate of a DRAM cell may be formed using a minimal number of masks and lithographic steps. Using this process, a DRAM cell comprising a vertical transistor and a buried word line may be formed. A gate dielectric may be disposed adjacent the active area, and the portion of the buried word line adjacent the gate dielectric may function as the vertically oriented gate for the vertical transistor. The DRAM memory cell may comprise one of a variety of capacitors, such a trench capacitor underlying the vertical transistor, or a stack capacitor overlying the vertical transistor. When a stack capacitor is used, a buried bit line underlying the vertical transistor may also be used.

In accordance with a preferred embodiment of the present invention, a method of forming vertically oriented semiconductor devices in an integrated circuit comprises forming substantially parallel first elongated trenches in a semiconductor region; filling the first elongated trenches with an insulator to form isolation lines; forming substantially parallel second elongated trenches in the semiconductor region, wherein the second elongated trenches cross and are substantially perpendicular to the first elongated trenches, and wherein pillars of the semiconductor region are formed between the elongated trenches; forming active areas for the vertically oriented devices in the pillars; and forming elongated buried word lines in the second elongated trenches, wherein portions of the word lines adjacent the active areas also form vertically oriented gates for the vertically oriented devices.

In accordance with another preferred embodiment of the present invention, an integrated circuit comprises first substantially parallel elongated trenches disposed in a semiconductor region; isolation lines disposed in the first elongated trenches; second substantially parallel elongated trenches disposed in the semiconductor region, wherein the second elongated trenches cross and are substantially perpendicular to the first elongated trenches, and wherein pillars of the semiconductor region are located between the elongated trenches; vertically oriented devices comprising active areas disposed in the pillars; and elongated word lines disposed in the second elongated trenches, wherein portions of the word lines adjacent the active areas are also vertically oriented gates for the vertically oriented devices.

An advantage of a preferred embodiment of the present invention is that a SELF ALIGNED trench structure may be formed for use in a DRAM cell. For example, a DRAM may be fabricated with a SELF ALIGNED trench, active area and gate.

Another advantage of a preferred embodiment of the present invention is that smaller device cells may be realized for a DRAM. For example, a cell size of 2 F×2 F, or 4 $F^2$ is possible using the teachings of the present invention.

Another advantage of a preferred embodiment of the present invention is that different types of capacitors, such as trench or stack, may be used depending on the requirements of the specific application.

Another advantage of a preferred embodiment of the present invention is that at least the initial processing may be performed on a long trench instead of isolated individual holes, thus providing a larger planar area and easier access for subsequent processing.

Another advantage of a preferred embodiment of the present invention is that a buried word line may be formed in the long trench, leaving the surface of the structure clear for other device elements.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which:

FIGS. 1–10 are plan and cross-sectional views of an integrated circuit structure in accordance with a preferred embodiment of the present invention at various stages of fabrication;

FIG. 11 is a plan view of the integrated circuit structure fabricated by the process illustrated in FIGS. 1–10;

FIGS. 12–21 are plan and cross-sectional views of an integrated circuit structure in accordance with another preferred embodiment of the present invention at various stages of fabrication; and FIG. 22 is a plan view of the integrated circuit structure fabricated by the process illustrated in FIGS. 12–21.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention. The figures are drawn so as to clearly illustrate the relevant aspects of the preferred embodiments, and are not necessarily drawn to scale.

The invention relates to integrated circuits, including memory ICs such as random access memories ("RAM"s), DRAMs, synchronous DRAMS ("SDRAM"s), merged DRAM-logic circuits ("embedded DRAM"s), or other circuits. The invention also relates to semiconductor processes and structures, including vertical transistors, and trench transistors, stack and trench capacitors, the connections between such semiconductor devices, or other processes and structures. The above-referenced U.S. Patent Application entitled SELF ALIGNED TRENCH AND METHOD OF FORMING THE SAME describes preferred DRAM applications for the present invention, and provides other information applicable to the present invention.

FIGS. 1–10 illustrate a first preferred embodiment for fabricating a DRAM array utilizing a trench capacitor. In each of these figures three views are shown.

Figure 1A:
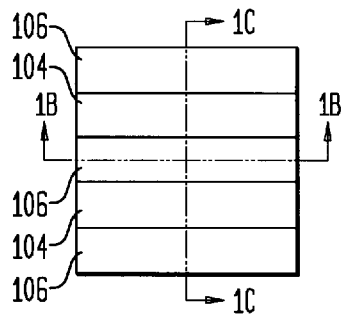
Figure 1B:
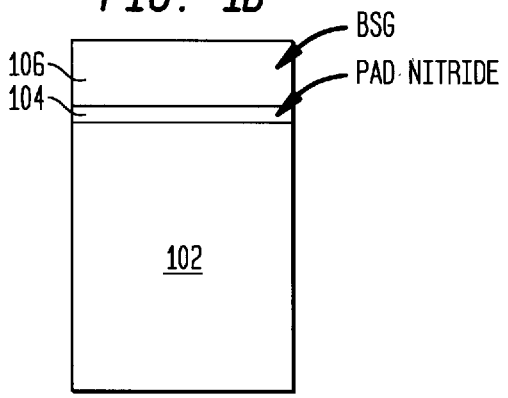
Figure 1C:
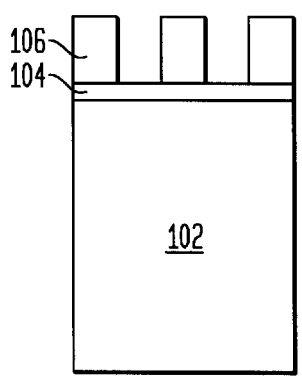
Figure 12A:
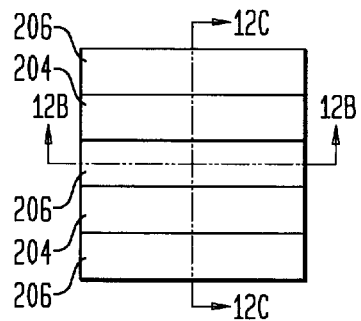

For example, FIG. 1a illustrates a plan view, FIG. 1b illustrates a cross-sectional view along the 1b line of FIG. 1a and FIG. 1c illustrates a cross-sectional view along the 1c line of FIG. 12a. At times the three views (e.g., FIGS. 1a, 1b & 1c) are collectively described without the letter (e.g., as FIG. 1).

The memory cell is formed in a semiconductor region 102. In the preferred embodiment, semiconductor region 102 comprises a silicon substrate. In other embodiments, semiconductor region 102 may comprise a semiconductor region over or within another semiconductor region, e.g., an epitaxial layer or a well (or tub or tank). Semiconductor region 102 may also comprise a semiconductor layer grown over an insulator (e.g., silicon-over-insulator ("SOI") or silicon-over sapphire).

In this embodiment, a number of layers are formed over semiconductor region 102. First a pad nitride layer 104, e.g., $Si_3N_4$, is deposited over semiconductor region 102, e.g., by chemical vapor deposition. A hard mask layer 106, e.g., borosilicate glass ("BSG") is then deposited over pad nitride 104. As will be shown below, the selection of particular materials used in the preferred embodiments may be based upon the materials being selective to etches used during the fabrication process. The particular materials may be changed in other embodiments.

Figure 2A:
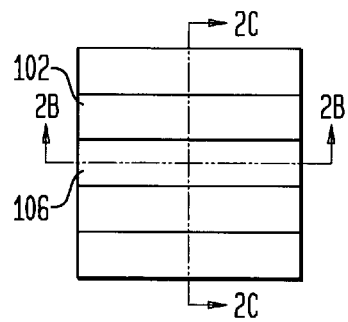
Figure 2B:
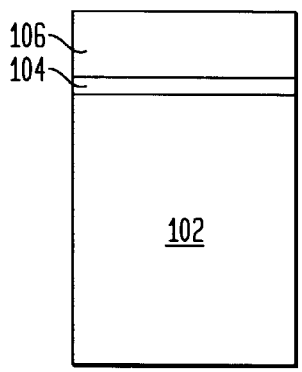
Figure 2C:
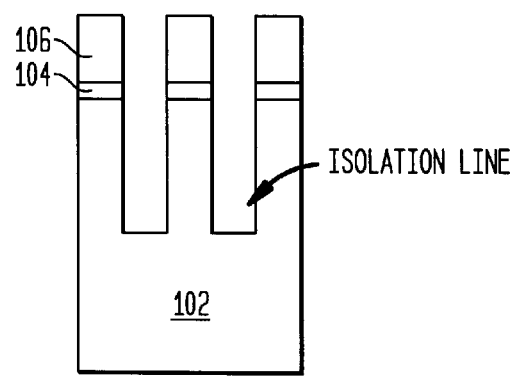

Hard mask layer 106 is patterned in substantially parallel elongated strips using a photoresist layer (not shown) and standard lithographic techniques. As used herein, "substantially" parallel means exactly parallel or within a few degrees of perpendicular. The photoresist may be any known photoresist, preferably one sensitive to ultraviolet radiation. As shown in FIG. 2, the portions of pad nitride layer 104 which are exposed by patterned hard mask 106 are etched, followed by an etch of semiconductor region 102, forming isolation line regions for the integrated circuit devices. A standard reactive ion etch ("RIE") technique may be used to etch semiconductor region 102.

Figure 3A:
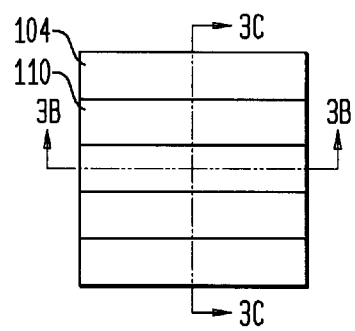
Figure 3B:
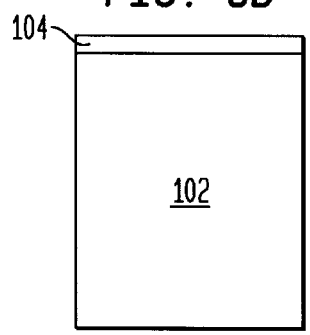
Figure 3C:
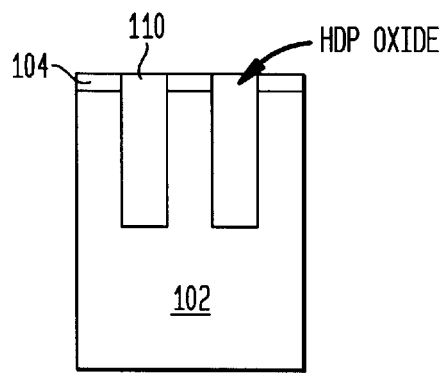

Referring now to FIG. 3, hard mask layer 106 is removed using a selective etch, such as a wet BSG etch. This is followed by a high density plasma ("HDP") oxide fill to fill the lines etched in semiconductor region 102, forming isolation lines 110. A chemical mechanical polish ("CMP") is then performed to planarize the structure. The portions of the semiconductor region 102 between isolation lines 110 will form the active area ("AA") of the devices, in which the source and drain vertical transistor will be formed.

Figure 4B:
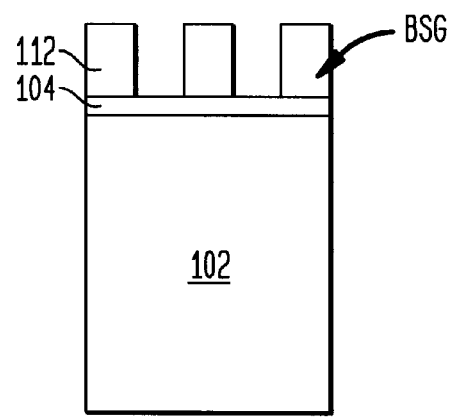
Figure 4C:
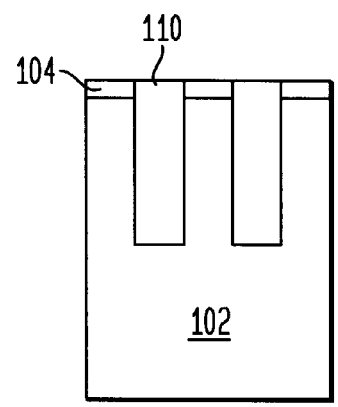

Referring now to FIG. 4, another hard mask layer 112 of e.g., BSG, is deposited over the surface of the device. Photolithography and another photoresist layer are again used to pattern this layer 112, but in this case the lines are substantially perpendicular to the lines and space pattern of the first lithographic process. This pattern will be used to define the word line, as well as the extent of the deep trench and the active area. As used herein, "substantially" perpendicular means exactly perpendicular or within several degrees (e.g., twenty degrees) of perpendicular.

Figure 5B:
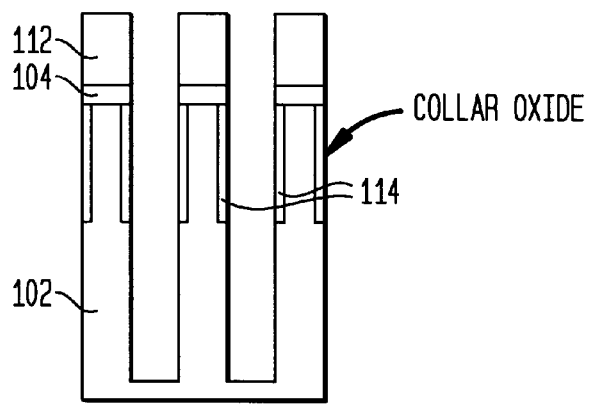
Figure 5C:
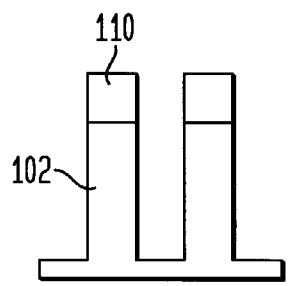

An etch is then performed on the exposed portions of pad nitride 104 and semiconductor region 102 using BSG 112 as a hard mask. This etch step only etches part way down into semiconductor region 102 (down to about the lower end of layer 114 in FIG. 5). Then a local oxidation of silicon ("LOCOS") or decomposition of tetraethyloxysilane ("TEOS"), or combination, is used to form collar oxide 114, shown in FIG. 5. Because the full trench has not yet been formed, the collar oxide only extends part way down into the trench shown in FIG. 5. Next, another RIE process is performed to open up the oxide formed on the bottom of the trench, and then to complete the formation of the deep trench. The deep trench is preferably between about 5 um to 10 um deep. In addition, a portion of isolation line 110 which is exposed during the deep trench etch will be recessed, as shown in FIG. 5c, with the overall resulting structure illustrated in FIG. 5.

Figure 6B:
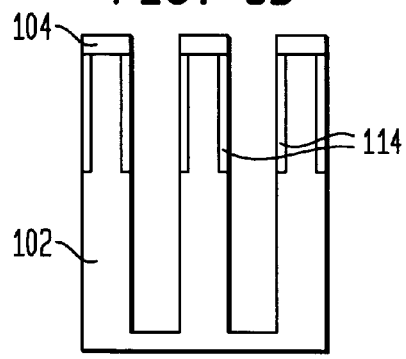
Figure 6C:
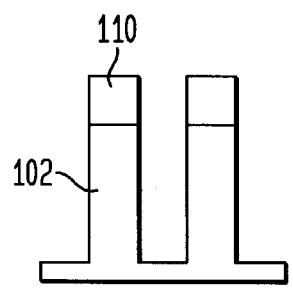

Referring now to FIG. 6, another hard mask strip, e.g., wet etch, is used to remove BSG 112 from the structure. Notably, the deep trench and the active area are now basically formed, generally in a SELF ALIGNED manner. In other words, no mask alignment is necessary to form the active area next to the deep trench.

Figure 8A:
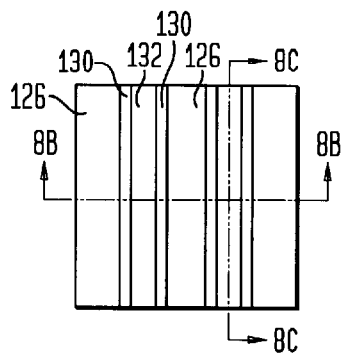
Figure 8B:
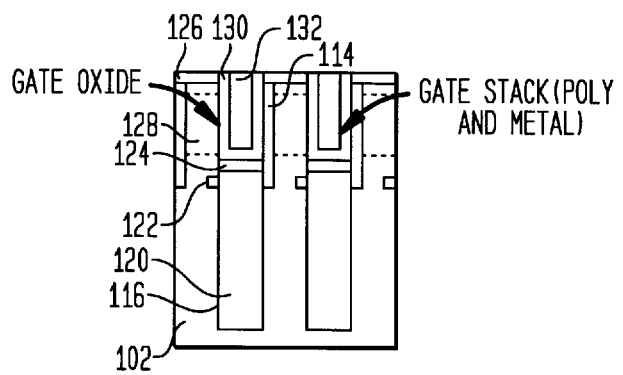
Figure 8C:
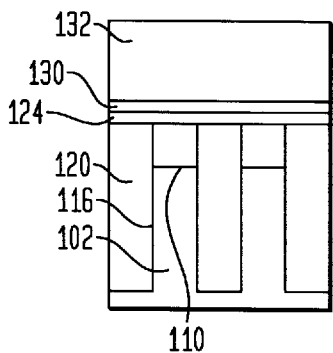

Referring now to FIGS. 7 & 8, a trench capacitor and vertical transistor are formed in the deep trench. These are preferably formed in accordance with the embodiments disclosed in the above referenced U.S. Patent Application entitled SYSTEM AND METHOD OF FORMING A VERTICALLY ORIENTED DEVICE IN AN INTEGRATED CIRCUIT. Briefly, as shown in FIG. 7, a buried plate is formed in semiconductor region 102 around the deep trench, and capacitor node nitride 116 is then formed in the trench as is known in the art. A deep trench poly fill and recess process is then performed to form doped poly layer 120, which forms the inner electrode of the trench capacitor.

This is followed by the removal of one side of collar oxide 114, exposing wall 118 of active area 128. After exposing active area 128, buried strap 122 is formed, in accordance with the above referenced patent application. Buried strap 122 electrically couples polysilicon region 120 with one of the source/drain regions of the DRAM cell's vertical transistor located in active area 128. The strap connects the active area to the trench and the node diffusion may be formed by dopant (e.g., arsenic) outdiffusion from the trench. Pad nitride 104 may be removed at this point in the process. Trench top oxide ("TTO") layer 124 is then formed on poly layer 120 in the trench, along with oxide layer 126 overlying active area 128. TTO layer 124 is formed by deposition in an HDP oxide chamber, where more oxide may be deposited on the planar surface compared to the sidewall. Because the HDP oxide deposition and etch are performed on an elongated line trench instead of individual holes, the process is generally more robust and easier to perform than prior art trench processes.

Referring now to FIG. 8, gate dielectric 130 (typically an oxide such as $SiO_2$) is formed along the exposed wall of active area 128, and then the remainder of the trench may be filled with a conductive material such as doped polysilicon/metal stack 132, followed by a CMP to planarize the structure. The conductive region 132 will serve as the gate for the adjacent pass transistor, and also functions as the wordline. Other advantages of the process are that crystal orientation is not critical, and that word line 132 may be buried.

Figure 10A:
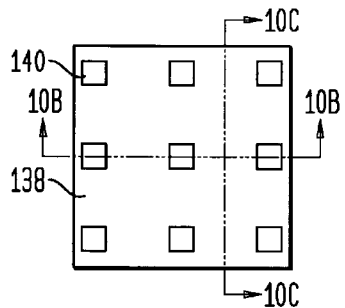
Figure 10B:
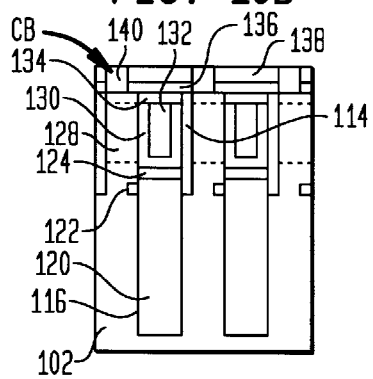
Figure 10C:
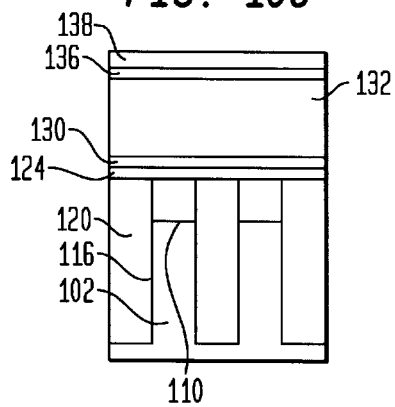

Referring now to FIG. 9, the polysilicon material 132 can then be etched below the surface of silicon active area 128. The conductive layer 132 may then be capped with a cap nitride 136 and borophosphosilicate glass ("BPSG") layer 138. These layers will serve to isolate the wordline 132 from the overlying bitline. As shown in FIG. 10, cap nitride 136 and BPSG layer 138 may be patterned using photolithography to form openings for the bit contact. Bit contact 140 may then be formed in the openings, providing connection between the underlying active area 128 and the overlying bitlines (not shown).

A plan view of the resulting structure is illustrated in FIG. 11, wherein deep trench area 142 is underlying the word line 152 and bit line 154. Gate oxide 148 is shown overlying the deep trench 142. Collar oxide 146 is adjacent the active area, with bit contact 150 overlying the active area. Isolation oxide 144 is located between each vertical transistor.

The remainder of a DRAM cell, including completing the connection to bit line, may be performed using conventional DRAM processing techniques. The resulting DRAM may then be employed in a variety of commercial and consumer electronics devices, including computers.

The preceding example has a number of other advantages over prior art processes. As one example, it is advantageous to form the active area and the deep trench using a single SELF ALIGNED step. Subsequently, a critical alignment step does not occur until the formation of the bitline contact.

FIGS. 12–21 illustrate a second embodiment DRAM process flow that also utilizes this advantage. As with the first embodiment, a single-sided junction device will be formed. This process uses substantially the same steps as the first embodiment described and therefore detailed description of these steps is not be repeated. Reference may be made to FIGS. 1–10 for description of similar process steps. The primary difference in this embodiment is the structure may be used with a stack capacitor instead of a trench capacitor.

Figure 12B:
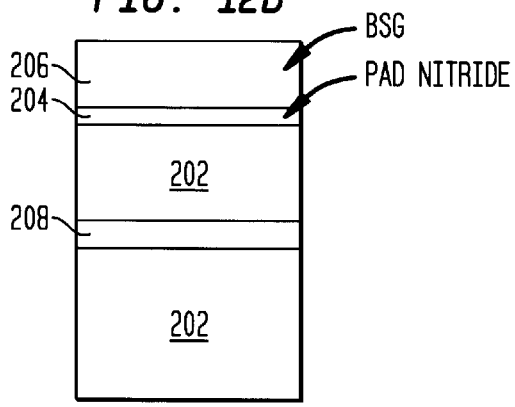
Figure 12C:
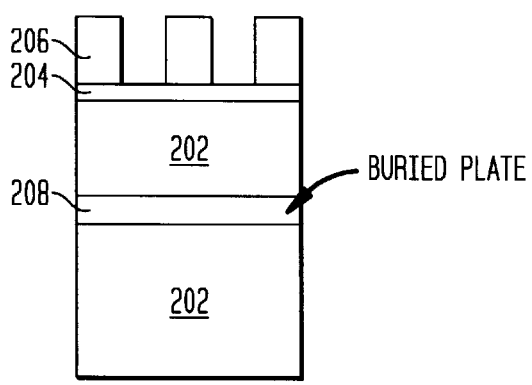
Figure 13A:
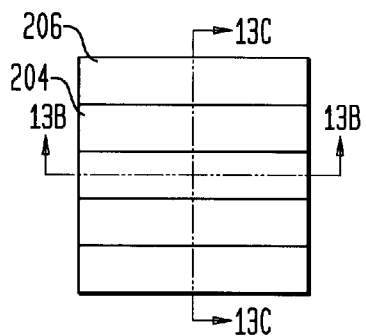
Figure 13B:
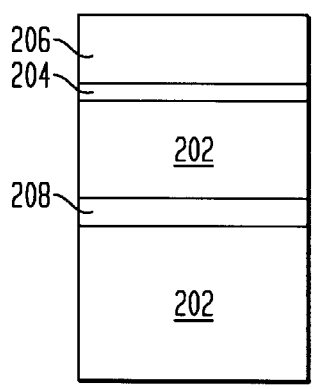
Figure 13C:
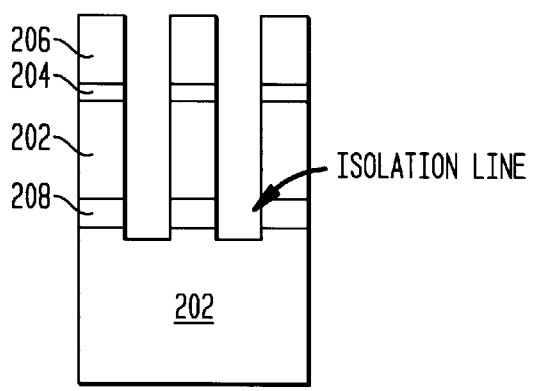
Figure 14A:
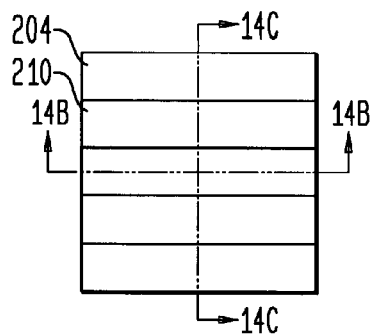
Figure 14B:
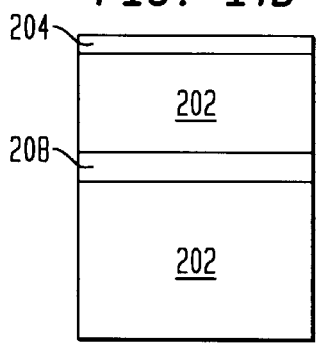
Figure 14C:
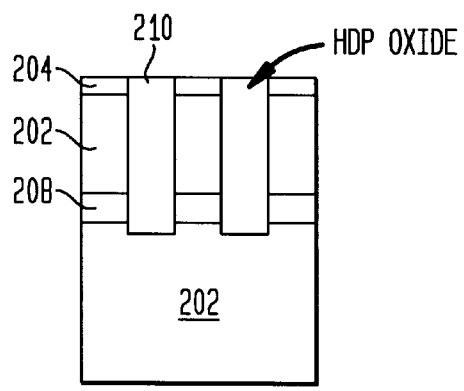
Figure 15B:
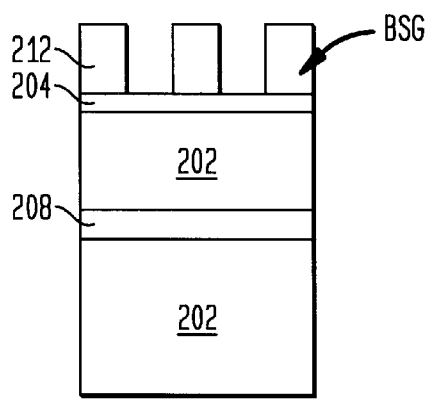
Figure 15C:
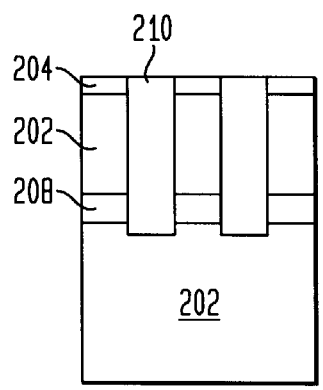
Figure 16B:
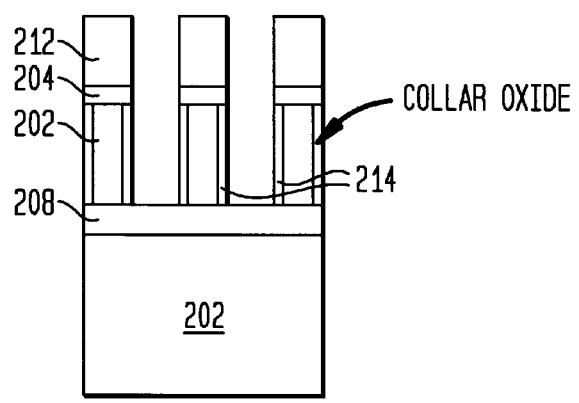
Figure 16C:
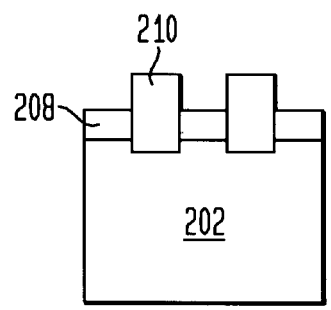
Figure 17B:
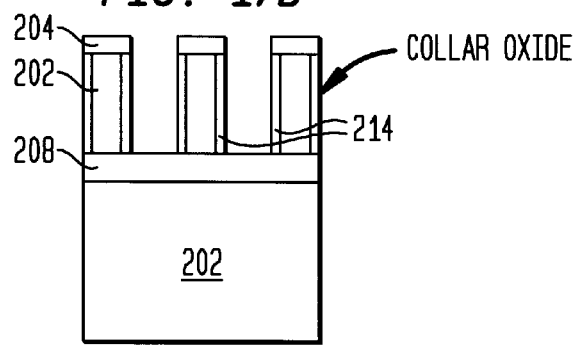
Figure 17C:
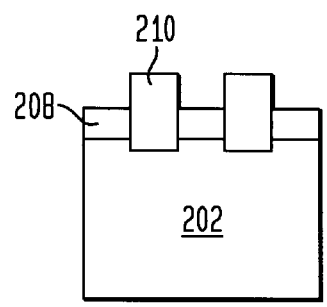

Referring now to FIG. 12, the initial structure differs from the structure of FIG. 1 in that a buried bit line plate 208 is formed in the semiconductor region 202. In FIG. 12, the isolation line lithographic step is used to etch down through the buried bit line plate to form bitline 208. FIGS. 14 and 15 follow processes analogous to those shown in FIGS. 3 and 4. In the word line and trench etch illustrated in FIG. 16, the trench etch only etches down to bitline 208, and does not form as deep a trench as the one formed in FIG. 5. This is because the capacitor will be formed on top of the structure and not in the trench as in the previous embodiment. In addition, formation of collar oxide 214 may be done after the trench etch is completed, since the complete etch only etches down to the bitline depth. FIG. 17 illustrates a strip of BSG hard mask 212, analogous to the process illustrated in FIG. 6.

Figure 18B:
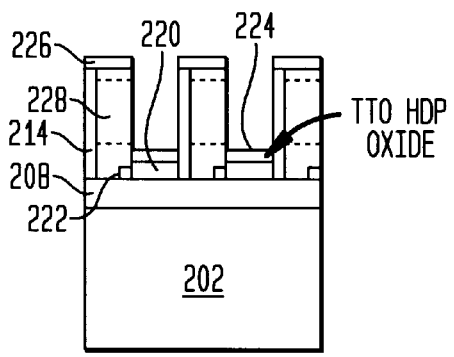
Figure 19A:
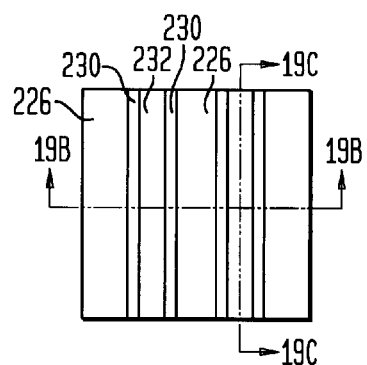
Figure 19B:
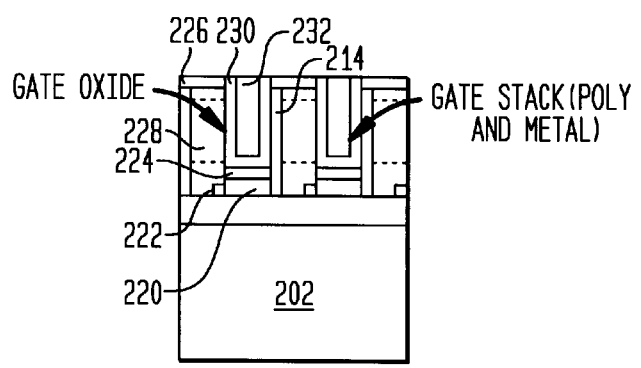
Figure 19C:
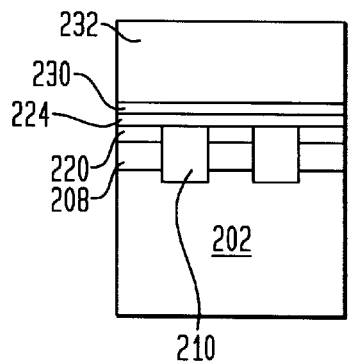

FIGS. 18 and 19 illustrate the formation of the vertical transistor, analogous to the processes described in FIGS. 7 and 8, except, of course, for the formation of the trench capacitor shown in FIGS. 7 and 8. Also, FIGS. 18 and 19 illustrate buried bitline 208 underlying the vertical transistor. Again, as shown in FIG. 19, the gate fill also functions to form buried word line 232, with the same advantages as those described with respect to the previous embodiment.

Figure 21A:
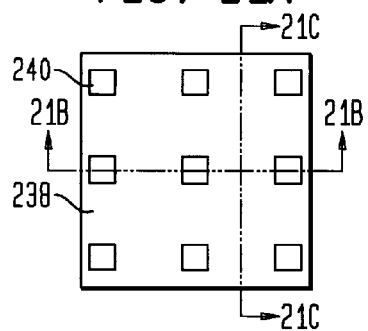
Figure 21B:
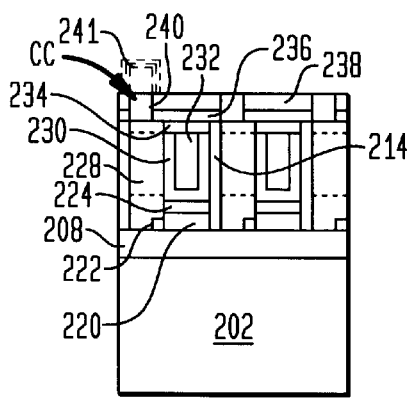
Figure 21C:
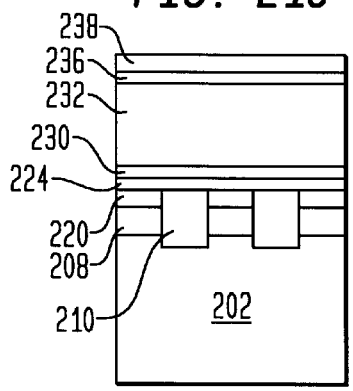

FIG. 20 illustrates the formation of cap nitride layer 236 and BPSG layer 238. Finally, as shown in FIG. 21, a lithographic process is used to etch through cap nitride 236 and BPSG layer 238 for the formation of capacitor contact 240 between underlying active area 228 and the overlying stack capacitor 241. In subsequent steps the stack capacitor 241 may be formed with a first plate contacting capacitor contact 240, a dielectric adjacent the first plate, and a second plate adjacent the dielectric, according to techniques well known in the art.

A plan view of the resulting structure is illustrated in FIG. 22, wherein word line 252 is formed in trench area 242. Buried bit line 254 is shown underlying trench area 242, as well the active area. Gate oxide 248 is shown adjacent word line 252. Collar oxide 246 is adjacent the active area, with capacitor contact 250 overlying the active area. Isolation oxide 244 is located between each vertical transistor.

The remainder of a DRAM cell, including the formation of the stack capacitor, may be performed using conventional DRAM processing techniques. The resulting DRAM may then be employed in a variety of commercial and consumer electronics devices, including computers.

There are many alternative materials and processes which could be substituted for those disclosed in the above embodiments by one of ordinary skill in the art, and all such alternatives are considered to be within the scope of the present invention. For example, the references incorporated herein by reference above disclose alternatives processes, structures and materials which may be used in accordance with the present invention. As another example, p-type materials or doping may be substituted for n-type materials and doping, and vice versa. In addition, the order of process steps may be rearranged by one of ordinary skill in the art, yet still be within the scope of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming vertically oriented semiconductor devices in an integrated circuit, the method comprising:

forming substantially parallel first elongated trenches in a semiconductor region;

filling said first elongated trenches with an insulator to form isolation lines;

forming substantially parallel second elongated trenches in said semiconductor region, wherein said second elongated trenches cross and are substantially perpendicular to said first elongated trenches, and wherein pillars of said semiconductor region are formed between said elongated trenches;

forming active areas for said vertically oriented devices in said pillars;

forming self aligned vertically oriented gate dielectric layers on said active areas in said second elongated trenches; and filling remaining portions of said second elongated trenches with elongated buried word lines, wherein portions of said word lines adjacent said gate dielectric layers on said active areas also form self aligned vertically oriented gates for single-gate vertically oriented devices.

2. The method of claim 1, wherein said forming said second elongated trenches comprises:

etching said second elongated trenches to a first depth;

forming oxide collars on walls of said pillars; and etching said second elongated trenches to a second depth deeper than said first depth.

3. The method of claim 2, wherein said forming said active areas comprises:

removing said oxide collars from one side of said pillars; and implanting a dopant into said side of said pillars.

4. The method of claim 2, further comprising forming trench capacitors in said second elongated trenches under said portions of said word lines adjacent respective ones of said active areas.

5. The method of claim 4, wherein said forming said trench capacitors comprises:

forming buried plates in sidewalls of said second elongated trenches;

forming dielectric layers on said buried plates in said second elongated trenches; and forming interior plates on said dielectric layers in said second elongated trenches.

6. The method of claim 5, further comprising forming buried straps connecting said interior plates to said respective active areas.

7. The method of claim 2, further comprising forming bit line contacts overlying and connected to respective ones of said active areas.

8. The method of claim 1, further comprising forming a buried bit line plate in said semiconductor region before said forming said first elongated trenches;
wherein said forming said first elongated trenches comprises etching through said buried bit line plate to form elongated buried bit lines; and
wherein said forming said second elongated trenches comprises etching said second elongated trenches down to said buried bit lines.

9. The method of claim 8, further comprising:
forming oxide collars on walls of said pillars after said etching said second elongated trenches;
removing said oxide collars from one side of said pillars; and
implanting a dopant into said side of said pillars.

10. The method of claim 8, further comprising forming buried straps connecting said buried bit lines to respective ones of said active areas.

11. The method of claim 8, further comprising forming capacitor contacts overlying and connected to respective ones of said active areas.

12. The method of claim 11, further comprising forming stack capacitors overlying and connected to respective ones of said capacitor contacts.

13. The method of claim 1, wherein said forming said active areas is performed before said forming said substantially parallel first elongated trenches.

14. A method of forming an integrated circuit memory array, the method comprising:
forming vertically oriented active areas in a semiconductor region of a substrate;
forming substantially parallel first elongated trenches in said semiconductor region;
filling said first elongated trenches with an insulator to form isolation lines;
forming substantially parallel second elongated trenches in said semiconductor region, wherein said second elongated trenches cross and are substantially perpendicular to said first elongated trenches, and wherein pillars of said vertically oriented active areas are formed between said elongated trenches;
forming self aligned vertically oriented gate dielectric layers on said vertically oriented active areas in said second elongated trenches; and
filling remaining portions of said second elongated trenches with elongated buried word lines, wherein portions of said word lines adjacent said gate dielectric layers on said active areas also form self aligned vertically oriented gates for single-gate vertically oriented transistors.

15. The method of claim 14, wherein said forming said second elongated trenches comprises:
etching said second elongated trenches to a first depth;
forming oxide collars on walls of said pillars; and
etching said second elongated trenches to a second depth deeper than said first depth.

16. The method of claim 15, further comprising forming trench capacitors in said second elongated trenches under said portions of said word lines adjacent respective ones of said active areas.

17. The method of claim 16, wherein said forming said trench capacitors comprises:
forming buried plates in sidewalls of said second elongated trenches;
forming dielectric layers on said buried plates in said second elongated trenches; and
forming interior plates on said dielectric layers in said second elongated trenches.

18. The method of claim 16, further comprising forming buried straps connecting said interior plates to said respective active areas.

19. The method of claim 15, further comprising forming bit line contacts overlying and connected to respective ones of said active areas.

20. The method of claim 14, further comprising forming a buried bit line plate in said semiconductor region before said forming said active areas;
wherein said active areas are formed over said buried bit line plate;
wherein said forming said first elongated trenches comprises etching through said buried bit line plate to form elongated buried bit lines; and
wherein said forming said second elongated trenches comprises etching said second elongated trenches down to said buried bit lines.

21. The method of claim 20, further comprising:
forming oxide collars on walls of said pillars after said etching said second elongated trenches; and
removing said oxide collars from one side of said pillars.

22. The method of claim 20, further comprising forming buried straps connecting said buried bit lines to respective ones of said active areas.

23. The method of claim 20, further comprising forming capacitor contacts overlying and connected to respective ones of said active areas.

24. The method of claim 23, further comprising forming stack capacitors overlying and connected to respective ones of said capacitor contacts.

* * * * *